United States Patent [19]

Nagano

[11] 4,213,064
[45] Jul. 15, 1980

[54] REDUNDANT OPERATION OF COUNTER MODULES

[76] Inventor: Robert A. Frosch, Administrator of the National Aeronautics and Space Administration, with respect to an invention of Satoshi Nagano, Long Beach, Calif.

[21] Appl. No.: 893,903

[22] Filed: Apr. 4, 1978

[51] Int. Cl.² .............................................. G06F 11/08
[52] U.S. Cl. .................................. 307/219; 307/225 R; 307/269; 307/291; 328/48; 328/71; 328/192
[58] Field of Search ................ 307/219, 263 R, 225 R, 307/269, 291; 328/48, 71, 192; 331/49, 55, 56

[56] References Cited

U.S. PATENT DOCUMENTS

| | | |
|---|---|---|
| 2,775,657 | 12/1956 | Van Zelst . |
| 3,117,237 | 1/1964 | Grady et al. . |
| 3,223,940 | 12/1965 | Early et al. . |
| 3,297,880 | 1/1967 | Clarke . |
| 3,345,578 | 10/1967 | Shuda . |
| 3,348,163 | 10/1967 | Hirst . |
| 3,479,603 | 11/1969 | Overstreet, Jr. . |
| 3,558,905 | 1/1971 | Oshima et al. . |
| 3,619,661 | 11/1971 | Butler, Jr. et al. . |
| 3,725,818 | 4/1973 | Nurmohamed et al. . |
| 3,769,607 | 10/1973 | Thelen . |
| 3,898,476 | 8/1975 | Straus . |
| 4,010,426 | 3/1977 | Rambo . |
| 4,016,503 | 4/1977 | Rambo . |
| 4,019,143 | 4/1977 | Fallon et al. . |
| 4,025,874 | 5/1977 | Abbey . |

FOREIGN PATENT DOCUMENTS 1330639  9/1973  United Kingdom ...................... 331/56

*Primary Examiner*—John Zazworsky
*Attorney, Agent, or Firm*—Monte F. Mott; John R. Manning; Paul F. McCaul

[57] ABSTRACT

Redundant operation of counter modules is maintained by detecting the zero state of each counter and clearing the other to that state, thus periodically resynchronizing the counters, and obtaining an output from both counters through AC coupled diode-OR gates. Redundant operation of counter flip-flops is maintained in a similar manner, and synchronous operation of redundant squarewave clock generators of the feedback type is effected by connecting together the feedback inputs of the squarewave generators through a coupling resistor, and obtaining an output from both generators through AC coupled diode-OR gates.

18 Claims, 5 Drawing Figures

REDUNDANT OPERATION OF COUNTER MODULES

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

This invention relates to improved redundant operation of counter modules, and to redundant clock drivers and flip-flop modules for counter modules. Clock drive circuits control the frequency of operation in many electronic applications. Reliability of operation of such circuits is of extreme importance in certain of these applications. For example in aerospace applications in which solar or battery DC power is inverted to AC, it is obvious that failure of the clock drive circuit would be catastrophic.

It is expected that such circuits will, in the not too distant future, be used in electric vehicle operation for inverting DC battery power to AC for more efficient power utilization and control. Thus, failure of the clock drive circuit would disable the inverter. If this happened while the vehicle is in high speed traffic on an express highway, the consequences could be disastrous.

Another near future use for such devices is expected to be found in the inversion of solar photovoltaic energy to the equivalent of utility power for supplying the needs of homes in remote or isolated regions. It can be readily appreciated that inverter failure due to clock drive loss would result in AC power failure. Still other situations where reliability is of upmost importance will occur to those skilled in the art.

Reliability is conventionally achieved by use of redundant modules. Any improvement in operation of such redundant arrangements which will provide more reliable operation is therefore of importance. One of the electronic elements frequently used with such clock drive circuits is the flip-flop circuit which is also subject to a high reliability requirement.

Achievement of reliability has been attempted by using modules in a redundant arrangement with appropriate switching to substitute an operative module for a failed module. Such arrangements have the undesirable characteristic that during the module substitution period, passage of the clock drive through the module is interrupted until the operative module takes over from the failed module. That may take a number of clock periods, which in turn may upset the system utilizing the redundant modules. Arrangements which eliminate such interruptions are therefore important.

Even with redundant clock drive circuits and redundant flip-flop modules, there may be a lack of reliable system operation if a counter in the system, which uses both clock pulses from the redundant clock drivers and redundant flip-flop modules, is not reliable. Achievement of counter reliability has been attempted by using redundant arrangement of counter circuits with appropriate switching to substitute an operative module for a failed module. However, unless such an arrangement provides for periodic synchronization of the count of each of the counter modules so that the count is continued in true sequence on substitution of a failed module, the system may fail to operate properly with the substituted module. Consequently, arrangements which provide for periodic cross-resetting of redundant counter modules are important.

SUMMARY OF THE INVENTION

In accordance with one feature of the invention, a simple and very reliable arrangement of redundant counter modules is provided with cross-coupled circuits which effects resetting of each module by the other module on a periodic basis so that the outputs of the redundant counter modules are always in the same state. This ensures continuance of sequential counting despite counter module substitution. Briefly that is accomplished by providing a clear input terminal to each redundant counter module that is held at an inactive logic level ($V_{cc}$) through bias resistors. Each module has an OR gate AC coupled to the output terminals thereof by differentiating circuits to produce a transition (1 to 0) at the output of the OR gate when the counter module enters the zero-count state. The output of the OR gate is AC coupled to the other module, or modules, to provide synchronization between counter modules on a periodic basis. A bank of AC coupled diode-OR gates couple the respective output of the redundant counters to respective output terminals. Each flip-flop of each redundant counter module may be provided with a redundant flip-flop in parallel with cross-coupled circuits which effects resetting of each redundant flip-flop by the other so that the outputs of the redundant flip-flops are always in the same state. For such redundancy of synchronous counter modules with high reliability, the clock pulse applied to the counter modules is derived from redundant clock pulse generators in a cross-feedback arrangement which forces frequency and phase synchronization so that when one of the modules fails, the frequency and phase of the output clock drive signal is unaffected. This is accomplished by connecting the inputs of feedback squarewave generators together through at least one high value cross-feedback register. Should one module fail, only the output signal from the survivor will be transmitted as the clock drive through AC coupled diode-OR gates. For greater reliability, the load resistor of each diode-OR gate, and the cross-feedback resistor, are provided with a redundant resistor in parallel. Active redundancy is thus achieved in the counter modules and the clock pulse generator as well without any substantial effect on clock pulse frequency and phase.

The novel features that are considered characteristic of this invention are set forth with particularity in the appended claims. The invention will best be understood from the following description when read in connection with the accompanying drawings.

DESCRIPTION OF PREFERRED EMBODIMENTS

Figure 1:
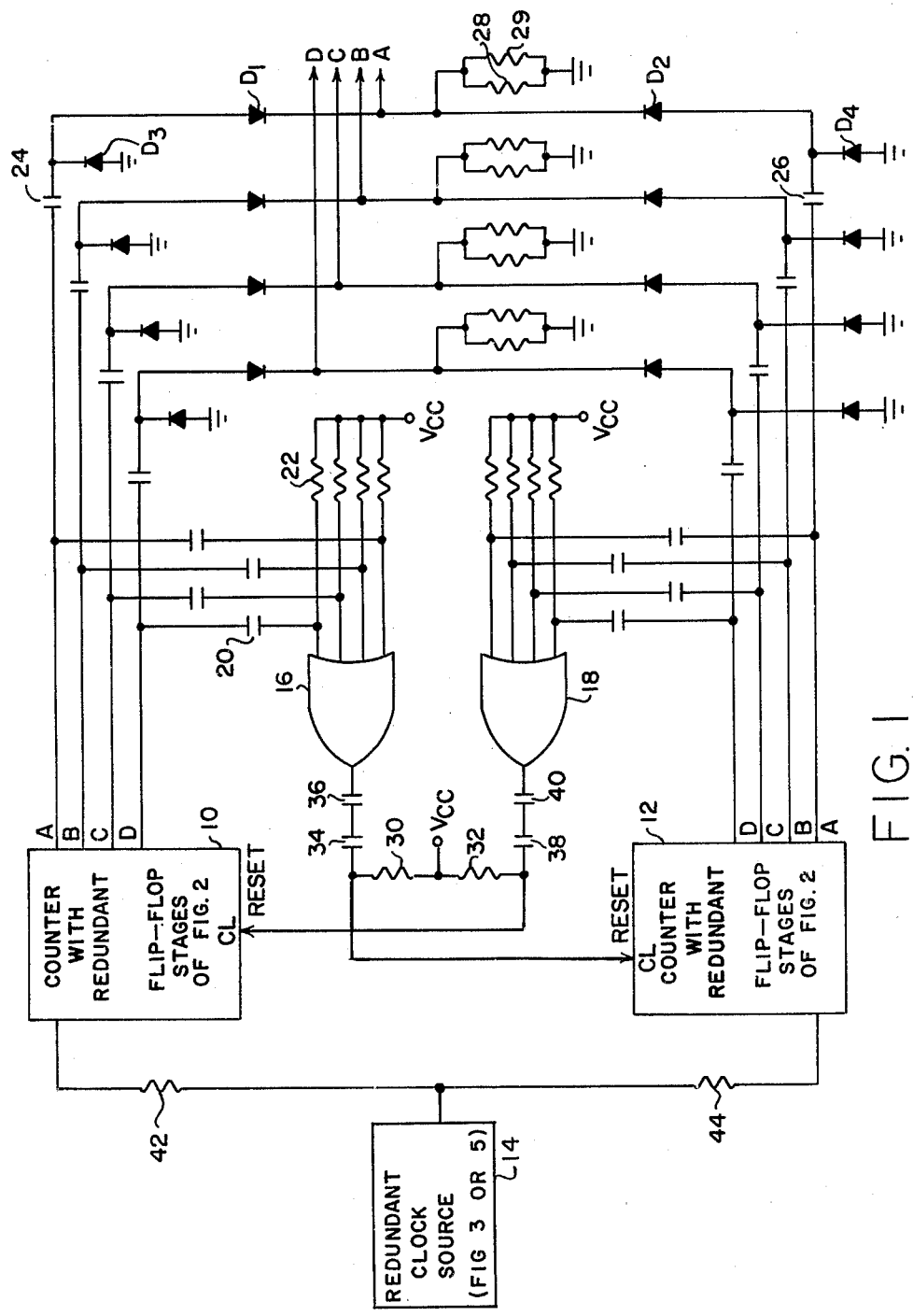
FIG. 1 illustrates a circuit for an improved redundant operation of counter modules.

Referring now to FIG. 1, redundant counter modules 10, 12 are shown driven in parallel from the same clock source 14. For improved reliable operation, the counters are used in an arrangement in which each of the modules effects resetting of the other module on a periodic basis in order to achieve synchronization which ensures continued counting in the event of failure of one of the modules. Resetting is accomplished through AC coupled OR gates 16 and 18 connected to the clear input terminals of the respective counters 10 and 12. These counters have outputs $Q_A$, $Q_B$, $Q_C$ and $Q_D$ representing numbers in a binary system, or some other system, such as binary coded decimal (BCD) system. Although the counters are shown in an arrangement wherein each counts clock pulses, they may also be used in an arrangement wherein each synchronously counts events from the same source applied to input terminals in which case the input terminals are low except during the occurrence of an event. Otherwise both input terminals are held high at all times to simply count clock pulses. For counting events, a buffer flip-flop synchronously couples the event signal to the input terminals such that for each event that occurs the input terminals of both counters will be high for only one clock period in a manner well known to those skilled in the art. These buffer flip-flops may also be provided as redundant circuits in a manner analagous to the flip-flops of the counters, which will be described with reference to FIG. 2.

Each of the OR gates 16 and 18 is AC coupled to the output terminals $Q_A$–$Q_D$ of its associated counter by an RC differentiating circuit, such as the circuit comprised of a capacitor 20 and resistor 22 coupling the output terminal $Q_D$ of counter 10 to one of four input terminals of the OR gate 16. The output terminals $Q_A$–$Q_D$ of the counters 10 and 12 are coupled to respective output terminals A–D through AC coupled diode-OR gates, such as diode-OR gate comprised of diodes $D_1$ and $D_2$ coupled to the $Q_A$ output terminals of the counters 10 and 12 by capacitors 24 and 26, and a redundant bias resistors 28 and 29 connected between output terminal A and circuit ground. The coupling capacitors and redundant bias resistors of a diode-OR gate form a differentiative circuit with a sufficiently long time constant to couple substantially square pulses for the rate of the clock pulses or events being counted. Diodes $D_3$ and $D_4$ clamp the anodes of the diodes $D_1$ and $D_2$ to circuit ground to reshape the pulse signals being passed by restoring zero (ground) reference for the pulses passed. This arrangement assumes logic 0 is a low (zero) signal, and logic 1 is a high (positive) signal. For the purpose of the following explanation it is assumed that a logic 0 or low level signal applied to the clear input terminals of counters resets all the counter outputs to the 0 or low state regardless of the clock state. Consequently, clear input terminals of both counters are normally held high by $V_{cc}$ voltage applied through resistors 30 and 32. Thus, with $V_{cc}$ applied, a low or negative going input is required to overcome the high on each clear input to effect resetting to the zero state. Note that access to the clear input terminals can be effected only through capacitors 34 and 36, or through capacitors 38 and 40, and that consequently only a negative going pulse will offset the applied bias ($V_{cc}$) in a negative direction to reset a counter. Two series capacitors are employed to couple the OR gate of one counter to the clear input of the other for greater reliability; a short in one of the two series capacitors will not cause a permanent clear signal to be transmitted.

The network consisting of resistor 30 and capacitors 34 and 36 differentiate the output of the OR gate 16 to produce a very narrow negative pulse at the moment all output terminals of the counter 10 go to logic 0 to clear the counter 12. Similarly the resistor 32 and capacitors 38 and 40 differentiate the output of the OR gate 18 to produce a very narrow negative pulse at the moment all output terminals of the counter 12 go to logic 0 to clear the counter 10. The only time all input terminals to the OR gate 16, or the OR gate 18, are simultaneously low is when all the outputs of the counter 10, or the counter 12, are low (logic 0). Thus, as either counter reaches a zero state of $Q_A=0$, $Q_B=0$, $Q_C=0$ and $Q_D=0$, the other counter is cleared, and thereby forced to the same state. In that manner the counters are periodically synchronized. The counter modules operate independently at all other times.

In the event of total failure of one counter, the other counter will continue to operate normally, even if the one counter fails in the clear state. Thus, despite one point failure, or total failure, of one module, the entire system of which the counters are a part will operate normally. For greater reliability, the counters may be implemented with redundant flip-flop modules as will be described with reference to FIG. 2. The clock source 14 coupled to the counters by isolating resistors 42 and 44 may also be implemented as a high reliability redundant clock driver as will be described with reference to FIG. 3.

Figure 2:
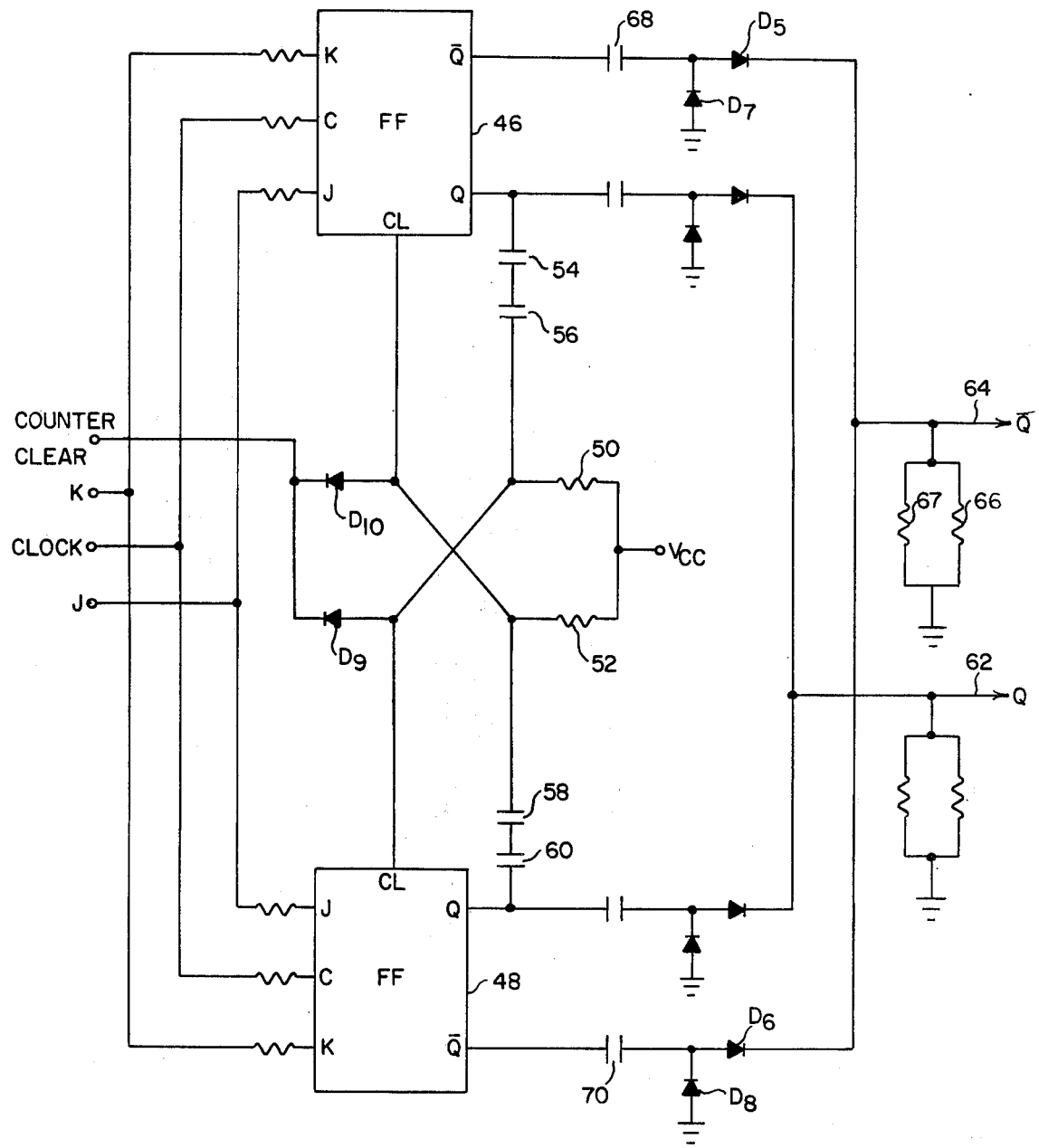
FIG. 2 illustrates a circuit for improved redundant operation of flip-flops.

Referring now to FIG. 2, redundant J-K flip-flops 46 and 48 are shown driven in parallel by the same clock pulse. Other types of flip-flops, such as the T-type or the D-type may use the present invention to equal advantage. The clear input terminal of both flip-flops are normally held high by a voltage $V_{cc}$ applied through resistors 50 and 52. Thus, with $V_{cc}$ applied, a low or negative going input is required to overcome the high on each clear input to effect resetting to the clear (zero) state. As with the redundant arrangement of the counters (FIG. 1), access to the clear input terminals can be effected only through capacitors 54 and 56, or through capacitors 58 and 60, and that consequently only a negative going pulse can offset the applied bias $V_{cc}$. Again, two capacitors in series are employed for greater reliability.

When either flip-flop is set to the zero state, it forces the other flip-flop to the same state by directly clearing it. In that manner, this novel interconnection between redundant flip-flop modules forces synchronization of modules. In the event of total failure of one flip-flop module, the other will continue to operate, thus effecting automatic substitution of modules on failure of one. The Q and Q outputs of the flip flops are coupled to respective output terminals 62 and 64 by diode-OR gates in the same manner the outputs of redundant counters in FIG. 1 are coupled to common output terminals. For example diodes $D_5$ and $D_6$, and resistors 66 and 67 form one diode OR gate for the Q output terminals to the redundant flip-flops 46 and 48. Coupling capacitors 68 and 70 function in the flip-flop modules in the same manner as coupling capacitors 24 and 26 in the counter modules (FIG. 1).

When the redundant flip-flops of FIG. 2 are employed in the counters shown in FIG. 1, it is necessary for each flip-flop to also be connected to receive the negative spike signals applied to the counters to clear them from the outputs of the differentiating circuits connected to the OR Gates 16 and 18. It would, of course, not be possible to simply connect the clear input terminal of the flip-flops 46 and 48 to the output of the differentiating circuit connected to the OR gate 18, because a clear pulse originating with the operation of the flip-flop 48, for example, would then clear not only the flip-flop 46 but also all other flip-flops of the counter. This is prevented by buffer diodes $D_9$ and $D_{10}$ connecting the counter clear signal (negative spike) to both flip-flops. The cathodes of both diodes are normally held at $V_{cc}$ through the resistor 32 (FIG. 1), assuming the flip-flops of FIG. 2 are in the counter 10 of FIG. 1. A counter clear signal momentarily drivers the cathode toward circuit ground potential, thus momentarily driving the clear input terminals of both flip-flops low.

Figure 3:
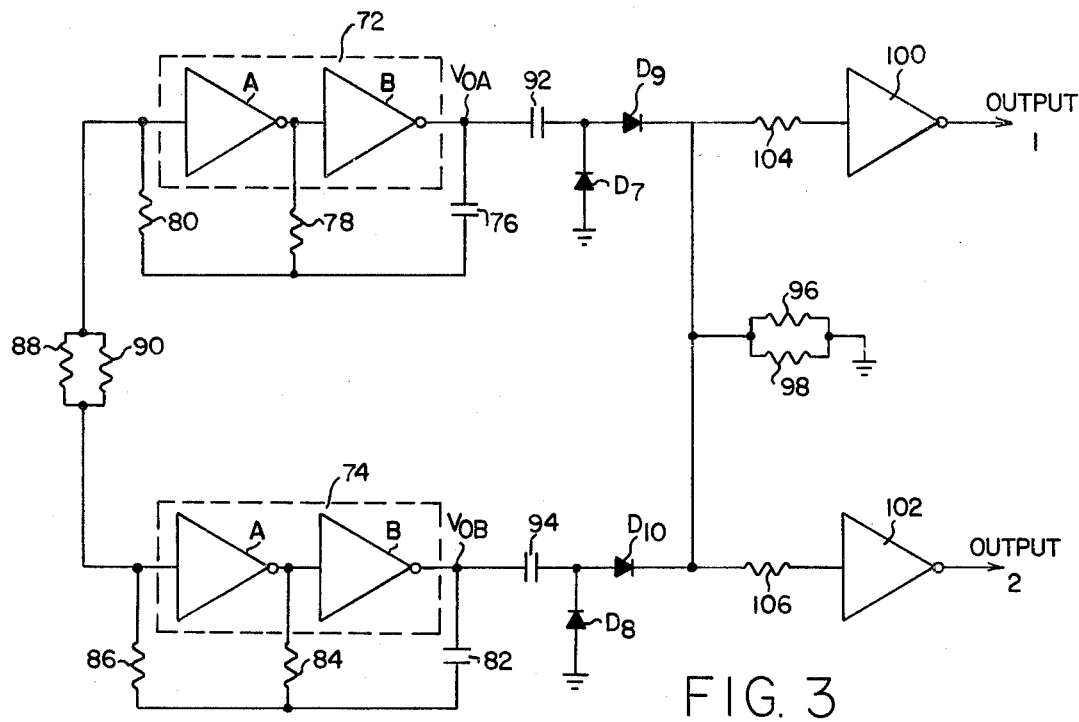
FIG. 3 illustrates a circuit for improved redundant operation of clock pulse generators of the feedback squarewave type.
Figure 4:
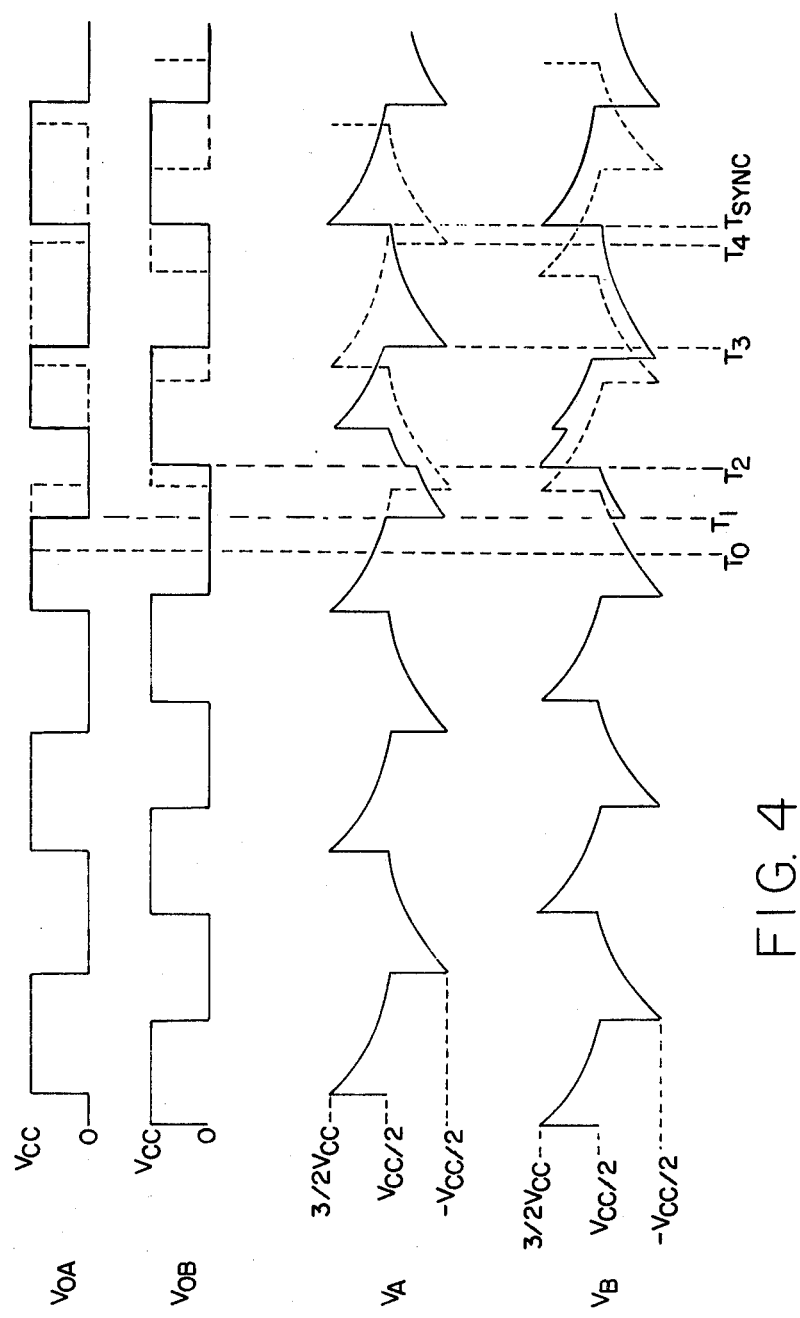
FIG. 4 illustrates signal waveforms useful in understanding the operation of FIG. 3.

The organization and operation of a high reliability redundant clock source will now be described with reference to FIGS. 3 and 4. The arrangement consists of two squarewave generator modules 72 and 74, each made up of two inverter sections A and B with an RC feedback loop from the clock output terminal of one section connected back to the input terminal of the other. Capacitor 76 and resistors 78 and 80 provide the RC feedback loop for the module 72. Similarly, capacitor 82 and resistors 84 and 86 provide the RC feedback loop for the inverter module 74. Redundant resistors 88 and 90 provide a feedback connection of one module to the other.

Two resistors are employed for this feedback connection to ensure a connection on failure of a connection through one resistor. Suitable values for one or both resistors are from 500 to 1000 k ohms, or an equivalent resistance value. Frequency of operation is determined by the RC time constant of the feedback loop in each squarewave generator module. The initial operating frequency of each redundant module is normally adjusted to the desired frequency of clock operation within a specified tolerance which might be ±6 to 10%, and thus one module might operate at 4.7 KHz and the other might operate at 5.0 KHz, as indicated in FIG. 4.

To understand the operation of this redundant clock source, consider the arrangement without the module interconnection through resistor 88 or 90. Each generator then operates independently, asynchronously as indicated in FIG. 4 to the left of the vertical broken line which is designated $T_o$. The waveforms $V_{OA}$ and $V_{OB}$ shown in FIG. 4 illustrate the square waveforms at the outputs of the inverter modules 72 and 74, respectively, with the square waveforms initially out of synchronization. The waveforms $V_A$ and $V_B$ shown illustrate the shape of the square waveforms capacitively coupled to the feedback resistors 78, 80 and 84, 86, respectively. With the impedance interconnection shown, synchronized operation would be forced as indicated to the right of the vertical broken line $T_O$, over a period of perhaps one millisecond. Referring to FIG. 4, the forcing signal of the upper module is $V_A$ and the forcing signal for the lower module is $V_B$. In each case, the forcing function is exerted through feedback resistors 80 and 86 and the interconnecting resistors 88 and 90. The waveform for these forcing signals are shown in dotted lines below the square wave clock pulses. It can be seen that the forcing signals $V_A$ and $V_B$ interact and have an effect on each other to produce the results indicated in solid lines in all four waveforms. Beginning in the interval from time $T_o$ to time $T_1$, the difference in the signals becoming less on each half cycle, until synchronization is effected at time $T_{sync}$. This is because the signal $V_B$ pulls down the signal $V_A$ at the input to inverter module 72 to cause its signal $V_{OA}$ to switch from $V_{CC}$ to 0 early at time $T_1$. Then the signal $V_A$ pulls down the signal $V_B$ to cause its signal $V_{OB}$ to switch from 0 to $V_{CC}$ late at time $T_2$. The process continues until at time $T_3$ synchronization is reached.

From the foregoing, it can be appreciated that either generator frequency can be higher or lower than the other, and as long as the difference in the frequencies is not too great, synchronization will be effected. This feature actually simplifies setting the original frequencies of the paralleled generators, and may be useful for other synchronization purposes in multiple module arrangements. Resistors 88 and 90 are of high resistance values. Thus if one fails, the effect on the frequency of the surviving module is minimal. The effect of failure of one of the modules on the output of the surviving module is minimized by use of capacitors 92 and 94, and diodes $D_7$ and $D_8$ in the output circuit of each module. These components form an AC coupled clamping circuit which couples the squarewave forms to a diode-OR gate comprised of diodes $D_9$ and $D_{10}$ and resistors 96 and 98. Two resistors are used for redundancy, and each may be on the order of 10 kilohm. This arrangement eliminates slight differences in the outputs of the modules which arise from threshold voltage differences of the inverter gates that make up the generators in each module.

The clock drive output may not be sufficiently high because of the diode drops, or other reasons, to drive all the circuits which depend upon clock drive. This may be overcome by using additional inverter gates or buffers, such as inverters 100 and 102 for each module connected to the output of the diode-OR gate by resistors 104 and 106, respectively.

Figure 5:
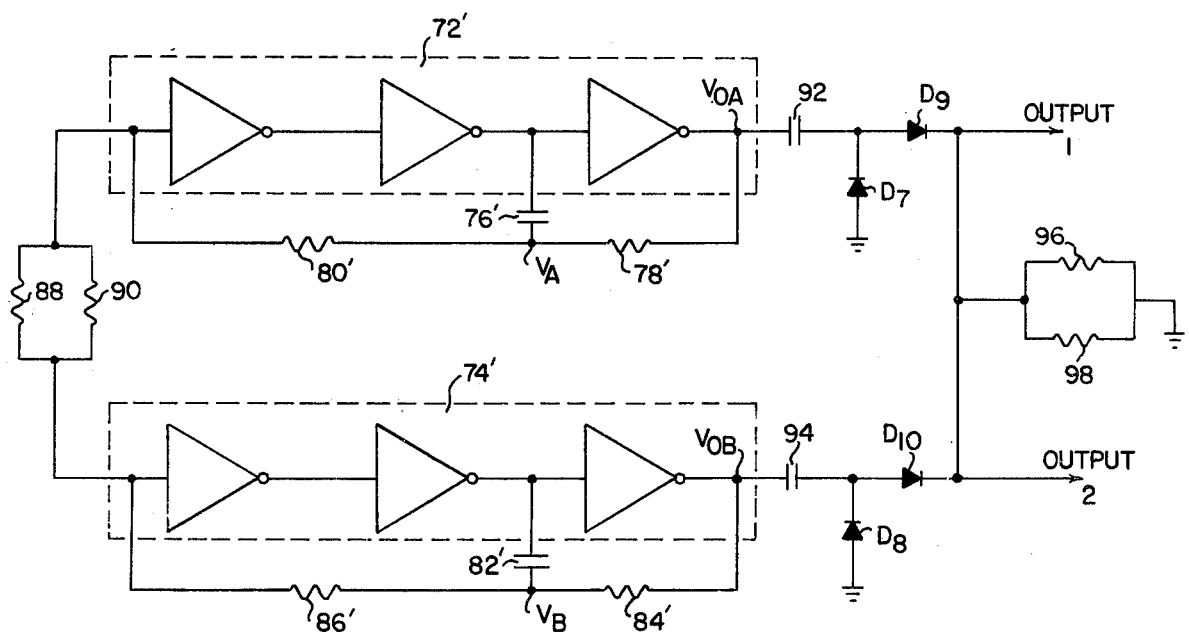
FIG. 5 illustrates a variation of the circuit of FIG. 3 for improved redundant operation of clock pulse generators of the feedback squarewave type.

FIG. 5 shows a variation in which the square waveform generators are composed of three inverter stages in series in each inverter module 72' and 74' with feedback from the second and third inverters to the first instead of from the second and the first inverter. Everything else being the same, the same reference numerals of FIG. 3 are applied to FIG. 4.

Although particular embodiments of the invention have been described and illustrated herein, it is recognized that modifications and variations may readily occur to those skilled in the art. It is therefore intended that the claims be interpreted to cover such modifications and variations.

What is claimed is:

1. In a system having a plurality of multistage counters for operation in parallel to provide a counter output code representative of a plurality of states, including a state representing a count of zero, for continued operation of said system in the event of failure of any one counter, the combination comprising separate detecting means connected to each counter for detecting the zero state thereof, thus providing a number of detecting means equal to the number of counters, one detecting means for each counter, separate AC coupling means connected to each of said detecting means for setting to the zero state all others of said counters upon detecting said zero state in any one counter, two single set of output terminals for all stages of said counters, one terminal for each stage of one counter shared by corresponding stages of all other counters, and unidirectional AC coupling means coupling each terminal of said set of output terminals to corresponding stages of said counters, whereby continued operation of any one counter will continue to provide a counter output code at said set of output terminals.

2. The combination of claim 1 wherein said unidirectional AC coupling means is comprised of a circuit for each stage of each counter having a capacitor in series with a diode coupling each output terminal to a stage of a counter, and further comprised of a separate plurality of load resistors for each stage, said load resistors for each stage being connected in parallel between an output terminal and circuit ground.

3. The combination of claim 1 wherein said separate AC coupling means connected to each of said detecting means is each comprised of a plurality of capacitors connected in series.

4. The combination of claim 1 wherein each stage of said counters is comprised of a plurality of flip-flops operated in parallel to provide continued operation of said system in the event of failure of any one of said flip-flops, each one of said flip-flops having one output terminal AC coupled to all others of said flip-flops operated in parallel to set all others to a predetermined state when said one is changed to said predetermined state, and unidirectional AC coupling means within the stage for coupling a corresponding output terminal of each of said flip-flops operated in parallel to a common one of said set of output terminals for said counters.

5. The combination of claim 4 wherein said unidirectional AC coupling means within each stage is comprised of a circuit for each flip-flop having a capacitor in series with a diode, and further comprised of a plurality of load resistors connected in parallel between said common one of said set of output terminals for said counters and circuit ground.

6. The combination of claim 4 wherein the one output terminal of each flip-flop AC coupled to all others of said flip-flops is so coupled by a plurality of capacitors connected in series.

7. The combination of claim 1 including a source of clock pulses for all of said counters operated in parallel, said source of clock pulses being comprised of a plurality of clock pulse generators operated in parallel, each having an output terminal for delivering clock pulses to a common output terminal, and means for continually forcing frequency and phase synchronization between said clock pulse generators so that if one clock pulse source fails, the frequency and phase of clock pulses delivered to said common output terminal are unaffected.

8. The combination of claim 7 wherein each of said plurality of clock pulse generators has a unidirectional AC coupling means for coupling the output terminal thereof to said common junction.

9. The combination of claim 8 wherein each of said unidirectional AC coupling means for coupling the output terminals of said clock pulse generators to said common junction is comprised of a circuit having a capacitor and a diode connected in series and a plurality of load resistors connected in parallel between said common junction and circuit ground.

10. The combination of claim 7 wherein each of said plurality of clock pulse generators is comprised of a squarewave generator having an input terminal and an output terminal, and having an RC feedback circuit connected from said generator output terminal to said generator input terminal for continued oscillation, and resistance means connecting the input terminals of all squarewave generators to one another.

11. The combination of claim 10 wherein said resistance means is comprised of a plurality of resistors connected in parallel from the input terminal of one squarewave generator to the input terminal of another squarewave generator.

12. A high reliability clock pulse generator comprised of a plurality of clock pulse generators, each generator being a squarewave generator having an RC feedback circuit from an output terminal to an input terminal for continued oscillation at a frequency determined in part by the time constant of said RC feedback circuit, and resistance means connecting the feedback circuit of each squarewave generator to the input terminal of all other squarewave generators, wherein each of said clock pulse generators is comprised of two inverter sections in cascade, each section having an input terminal and an output terminal, and said RC feedback circuit is comprised of a capacitor and a series resistor between the output terminal of the second inverter section to the input terminal of the second inverter section.

13. The combination of claim 12 including a second resistor connecting a junction between said capacitor and series resistor to the input terminal of the first inverter section.

14. The combination of claim 13 wherein said clock pulse generator includes a third inverter section between the first and second inverter sections.

15. In a digital system, the combination of a plurality of flip-flops operated in parallel to provide continued operation of said system in the event of failure of any one of said flip-flops, each one of said flip-flops having one output terminal AC coupled to all others of said flip-flops operated in parallel to place them in a predetermined one of two states when it is changed to said predetermined state, and separate unidirectional AC coupling means coupling the corresponding output terminal of each of said flip-flops operated in parallel to a common output terminal.

16. The combination of claim 15 wherein said unidirectional AC coupling means is comprised of a capacitor in series with a diode and a plurality of load resistors connected in parallel between said common output terminal and circuit ground.

17. The combination of claim 15 wherein said one output terminal of each flip-flop AC coupled to all others of said flip-flops is so AC coupled by a plurality of capacitors connected in series.

18. An arrangement of counters, each having a unique set of output terminals AC coupled to a set of common output terminals and all provided with cross-coupled circuits which effect setting of each counter to a predetermined state by each other counter entering said predetermined state on a periodic basis so that the counters are periodically resynchronized to insure continuance of sequential counting despite failure of one counter wherein each respective counter has a clear input terminal and a bias resistor that holds the clear input terminal at an inactive logic level, and has a separate detecting gate with input terminals AC coupled to the respective counter output terminals by differentiating circuits to produce a transition from one logic level to another logic level at the output of the detecting gate when the counter enters the predetermined state, wherein said arrangement further comprises means for AC coupling the output of the detecting gate of each counter to the clear input terminal of each other counter, thereby to provide synchronization between counters on a periodic basis, and wherein each set of output terminals of said counters is AC coupled to said set of common output terminals by a plurality of AC coupled diode-OR gates, a separate diode-OR gate for coupling each counter output terminal to the corresponding one of the set of common output terminals.

* * * * *